(12) United States Patent
Gallahan et al.

(10) Patent No.: US 7,724,542 B2
(45) Date of Patent: May 25, 2010

(54) REWORKABLE RF SHIELD

(75) Inventors: Ron W. Gallahan, Portland, OR (US); Richard S. Perry, Portland, OR (US); Michael Stewart, Hillsboro, OR (US); Pedro A. Gutierrez, San Diego, CA (US); Donald M. Hammon, Fox Island, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/618,817

(22) Filed: Dec. 30, 2006

(65) Prior Publication Data

US 2008/0158849 A1 Jul. 3, 2008

(51) Int. Cl.
*H05K 9/00* (2006.01)

(52) U.S. Cl. .................................. 361/816; 361/818

(58) Field of Classification Search ................. 361/800, 361/816, 818; 174/51, 35 R
See application file for complete search history.

(56) References Cited

U.S. PATENT DOCUMENTS

| | | | | |
|---|---|---|---|---|
| 5,495,399 | A * | 2/1996 | Gore et al. .................. 361/814 |
| 5,614,694 | A * | 3/1997 | Gorenz et al. ............... 174/375 |
| 6,137,692 | A * | 10/2000 | Venant ........................ 361/800 |
| 6,178,097 | B1 * | 1/2001 | Hauk, Jr. .................... 361/816 |
| 6,320,121 | B1 | 11/2001 | Honeycutt et al. ......... 174/35 R |
| 6,377,472 | B1 * | 4/2002 | Fan ............................. 361/800 |
| 6,384,324 | B2 * | 5/2002 | Flegeo ........................ 174/390 |
| 6,501,016 | B1 * | 12/2002 | Sosnowski .................. 174/382 |
| 6,563,042 | B2 | 5/2003 | Barabash .................. 174/35 R |
| 6,731,518 | B2 * | 5/2004 | Suzuki et al. ............... 361/818 |
| 6,763,245 | B1 * | 7/2004 | Satoh et al. ............. 455/550.1 |
| 6,897,371 | B1 * | 5/2005 | Kurz et al. .................. 174/382 |
| 6,897,373 | B2 | 5/2005 | Barabash .................. 174/35 R |
| 7,084,356 | B2 * | 8/2006 | English et al. .............. 174/361 |
| 7,119,286 | B1 * | 10/2006 | Horng ........................ 174/379 |
| 7,208,675 | B2 * | 4/2007 | Horng ........................ 174/377 |
| 2002/0139552 | A1 * | 10/2002 | Chang ....................... 174/35 R |
| 2004/0134244 | A1 * | 7/2004 | Mitsuyama ................. 70/57.1 |
| 2005/0121212 | A1 * | 6/2005 | English et al. .......... 174/35 GC |

* cited by examiner

*Primary Examiner*—Hung S Bui
(74) *Attorney, Agent, or Firm*—Konrad Raynes & Victor, LLP; Alan S. Raynes

(57) ABSTRACT

Certain embodiments relate to electronic devices and methods for forming electronic devices having a component shielded by a reworkable RF shield. The RF shield may be positioned to surround one or more components on a substrate. The RF shield may include a plurality of sidewalls and a top wall, the plurality of sidewalls including bumps extending outward therefrom. A portion of the top wall may be removed from the RF shield. The one or more components positioned under the top wall of the RF shield may be repaired or replaced if necessary. A lid may then be positioned over the removed portion of the top wall and placed so that the bumps engage apertures in the lid and result in the lid being rigidly coupled to the sidewalls. In one aspect of certain embodiments, a groove may be formed on one or more surfaces of the top wall. Other embodiments are described and claimed.

15 Claims, 6 Drawing Sheets

REWORKABLE RF SHIELD

RELATED ART

Radio frequency (RF) circuits in electronic devices may generate significant noise or electromagnetic interference (EMI). The EMI can have a deleterious effect on the operation of adjacent electronic circuits in the device. As a result, it becomes necessary to protect the adjacent electronic circuits.

One way to protect sensitive components from EMI is through the use of RF shields. An RF shield may be formed as a conductive structure that surrounds and encloses one or more components, to inhibit RF radiation from entering, leaving, or passing through the RF shield. Such shields are typically formed from metals, and often include a plurality of sidewalls (also known as a fence) and an interconnecting top wall. Typically, RF shields have fours sidewalls and the top wall, thus forming a five-sided enclosure that defines a cavity that is sized to accept one or more electronic components therein. For a component on a printed circuit board, for example, the RF shield is typically placed over the component and then soldered to the board.

The shielded component may need maintenance or replacement during its service life. To reach a shielded component, it may be necessary to unsolder the shield from the board, which is time consuming and costly. It is useful to have access to a component without having to completely remove the shield. In an effort to provide easier access, RF shields having a removable cover have been developed. These designs have a number of disadvantages relating to, for example, the ease of removal, attachment of the cover, complexity of design, and cost.

BRIEF DESCRIPTION OF THE DRAWINGS

Embodiments are described by way of example, with reference to the accompanying drawings, which are not drawn to scale, wherein.

DETAILED DESCRIPTION

Figure 1:
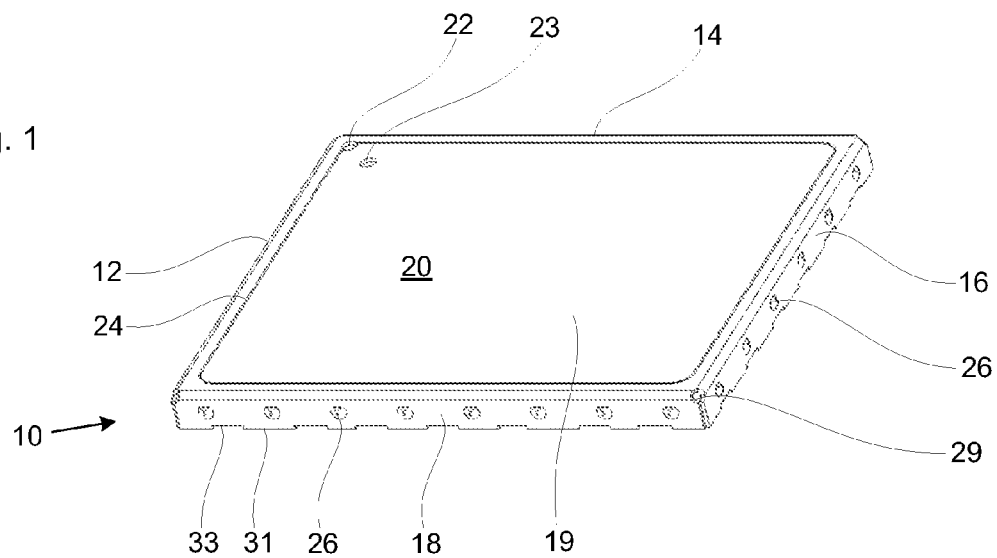
FIG. 1 illustrates a view including a top surface of a reworkable shield, in accordance with certain embodiments.

FIG. 1 illustrates a reworkable RF shield 10 in accordance with certain embodiments. The reworkable RF shield 10 includes sidewalls 12, 14, 16, 18, as well as a top wall 20. A top surface 19 of the top wall 20 may include a groove 24 formed therein. Apertures 22 and 23 are also provided through the top wall 20. The aperture 23 is sized to permit the tip of a tool 70 (FIG. 3) to fit there. The tool 70 is used to peel back a portion of the top wall 20. The portion of the top wall 20 that may be peeled back is defined in FIG. 1 by the groove 24. The groove 24 as illustrated in the embodiment of FIG. 1 extends generally parallel to the sidewalls 12, 14, 16, 18 around a portion of the top wall 20. The groove 24 acts to promote a smooth and controlled peeling back of the removable portion of the top wall 20 in a desired location. In certain embodiments, the groove 24 may be substantially V-shaped, may be positioned about 1 mm from the sidewalls 12, 14, 16, 18, and may extend about 0.08 mm to about 0.1 mm deep. The aperture 22 is provided at a position in alignment with the groove 24 so that after the tool is inserted into the opening 23 and sufficient force applied, the removable portion of the top wall 20 will start to peel back at the aperture 22. Any suitable method for forming the RF shield 10 structure may be used. For example, in certain embodiments, the shield 10 is formed from a sheet of metal that is cut and folded to create the side surfaces 12, 14, 16, 18. A relief cut 29 resulting from such a formation process is illustrated at the shield corners in FIG. 1. In certain embodiments, the shield top wall 20 is about 0.15 mm to about 0.2 mm thick.

FIG. 1 also illustrates a plurality of bumps 26 extending outward from the sidewalls 12, 14, 16, 18. The bumps 26 are designed to form a tight fit with a lid 110 (FIG. 3) that may be positioned thereon. In certain embodiments, such as illustrated in FIG. 1, the bumps have a substantially conical shape, with a D-shaped perimeter having the flat side of the D shape at the portion of the bump 26 closest to the top wall 20 of the shield 10. Such a lid 110 is positioned on the RF shield 10 after the removable portion of the top wall 20 has been removed. The sidewalls 12, 14, 16, 18 also may be formed with feet regions 31 for coupling to a board, and slot regions 33 between the feet regions 31, for permitting circuit board traces to access the interior regions under the shield 10.

Figure 2:
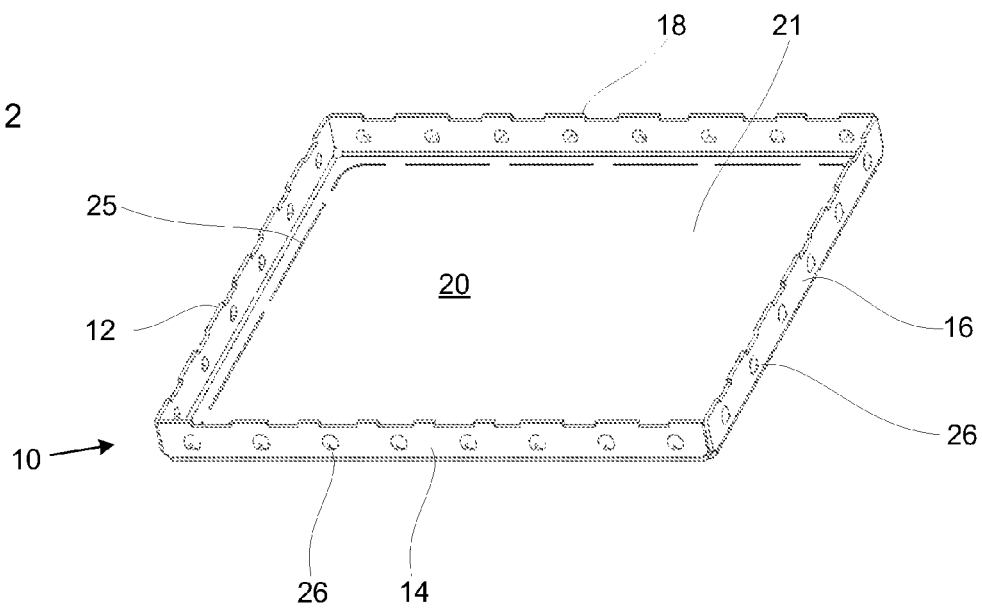
FIG. 2 illustrates a view including an interior surface of a reworkable shield, in accordance with certain embodiments.

FIG. 2 illustrates a view of interior portions of the reworkable RF shield 10 in accordance with certain embodiments. Another groove 25 may be formed on a bottom surface 21 of the top wall 20, if desired. The groove 25 acts to further ensure that the peeling back of the removable portion of the top wall 20 takes place in a smooth and controlled manner in the desired location. The groove 25 may in certain embodiments have a dotted line form and extend around only a portion of the removable portion of the top wall 20, in order to facilitate removal at a desired location. In certain embodiments, the grooves 24, 25 may both be formed to have a V-shaped configuration.

In certain embodiments, the bumps 26 may be formed by a pressing process in which the metal used for the shield is pressed to form the bumps in the appropriate location. Thus, when viewed from outside the shield, as in FIG. 1, the bumps extend outward from the sidewalls 12, 14, 16, 18 of the shield 20. As illustrated in FIG. 2, what appear as bumps 26 when viewed from outside the shield appear as dimples when viewed from the inside. Other embodiments may form the bumps on the sidewall surfaces without also forming dimples when viewed from the inside of the shield.

Figure 3:
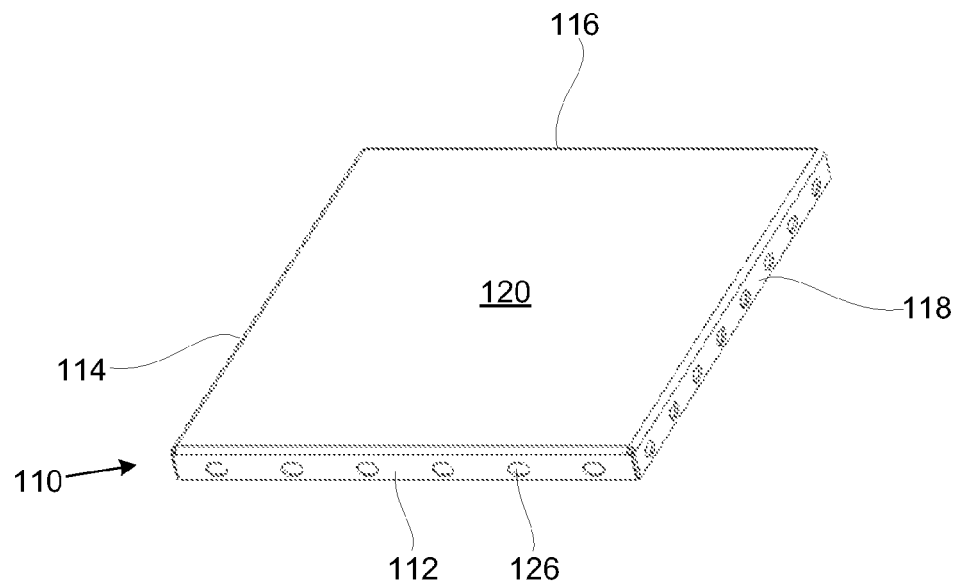
FIG. 3 illustrates a lid for insertion on a reworked shield, in accordance with certain embodiments.

FIG. 3 illustrates a lid 110 that is adapted to fit over the RF shield 10 after the removable portion of the top wall 20 has been removed. The lid 110 includes sidewalls 112, 114, 116, 118 and a top wall 120. The lid 110 in certain embodiments is formed from a single piece of an electrically conducting material such as a metal. The lid sidewalls 112, 114, 116, 118 may include a plurality of apertures 126 sized and shaped to engage the bumps 26 on the sidewalls 12, 14, 16, 18 of the RF shield 10, so that a tight fit is formed between the lid 110 and the sidewalls 12, 14, 16, 18 of the RF shield 10. In certain embodiments, the apertures 126 may be substantially oval in shape.

Figure 4:
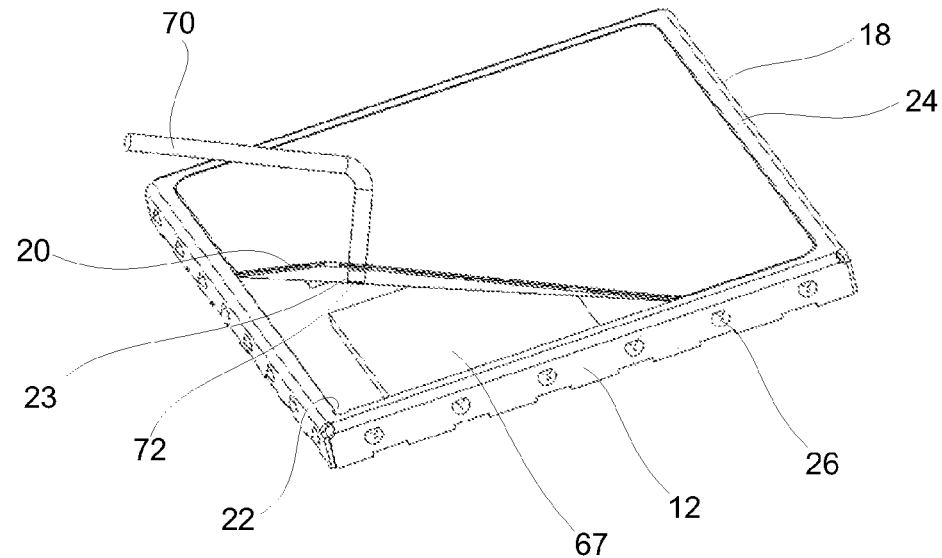
FIG. 4 illustrates a view of a reworkable shield in which a tool is lifting a removable portion of the shield, in accordance with certain embodiments.

FIG. 4 illustrates a view of the top wall 20 of the reworkable RF shield 10 being partially peeled back, exposing component 67, which may be, for example, a front-end module (FEM). A tool 70 with tip region 72 is used to peel back the removable portion of the top wall 20. The tip region 72 fits through the aperture 23 in the top wall 20. As a force is applied to the tool 70, the tip region 72 pulls on the corner of the removable portion of the top wall 20 at the aperture 22, and when a suitable force is applied, the removable portion of the top wall 20 peels back, along the groove 24 (and the groove 25 on the bottom surface of the top wall 20). After the removable portion of the top wall 20 is fully peeled back and removed from the shield 10, any repair or replacement of the exposed components (such as component 67) may be carried out. After any repair or replacement of components is completed, a lid is positioned on the remaining shield.

Figure 5:
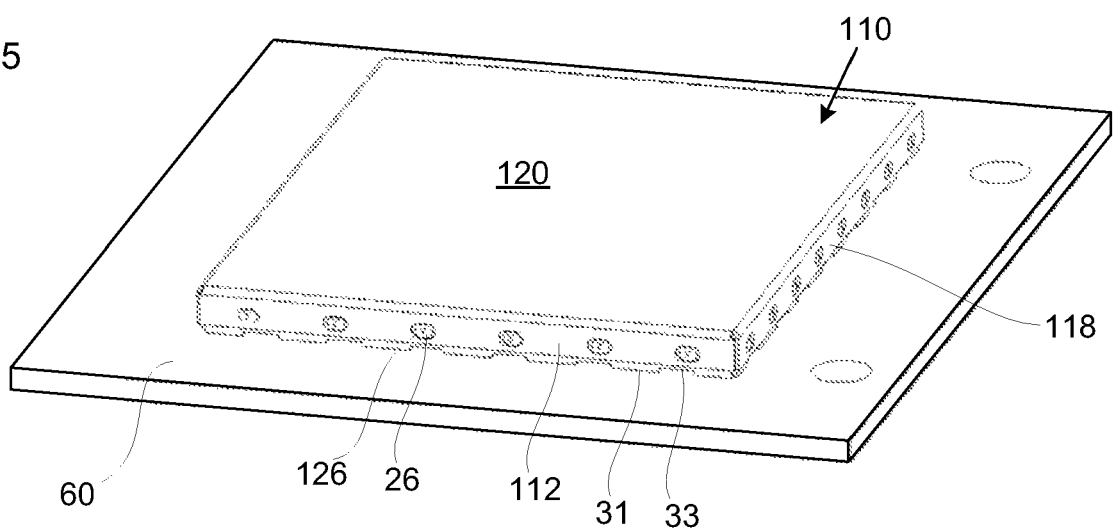
FIG. 5 illustrates a view of a lid positioned on a reworked shield, with bumps on the shield sidewalls fitting into apertures in the lid, in accordance with certain embodiments.

FIG. 5 illustrates the lid 110 positioned on the remaining shield 10, with the shield 10 mounted on substrate 60. The feet regions 31 and the slot regions 33 of the shield 10 can be seen in FIG. 5 below the lid 110, for example, below the sidewall 112 of the lid 110. The substrate 60 may comprise a printed circuit board having one or more components that are covered by the RF shield 10. In certain embodiments, other components not covered by the shield 10 may also be positioned on the board. The lid 110 is coupled to the remaining portion of the shield 10, with the bumps 26 on the sidewalls 12, 14, 16, 18 extending at least partially through the apertures 126 in the lid sidewalls 112, 114, 116, 118 in a manner that provides a tight fit.

The RF shield may be formed from a variety of materials that are capable of shielding components from electromagnetic interference. Certain embodiments utilize metals for the reworkable shield and the lid. Certain metals are easier to form solder connections to than others, and may be utilized where soldering properties are important. Examples of metals which may be used in certain embodiments include nickel-silver alloys, and stainless steel. Generally, nickel-silver alloys are easier to solder than stainless steels. As a result, in one embodiment, the RF shield, such as the RF shield 10 in FIG. 1, is formed from a nickel-silver alloy. The lid, such as the lid 110 in FIG. 3, may also be formed from a nickel-silver alloy. Alternatively, to save costs, in one embodiment, the lid 110 is formed from a stainless steel.

A number of variations to the RF shield 10 illustrated in FIG. 1 may be made. For example, certain embodiments may utilize a single opening such as the opening 22, without the need for the opening 23. In addition, certain embodiments need not utilize groove 24 on the upper surface of the top wall and groove 25 on the lower surface of the top wall, as illustrated in FIGS. 1-2. Depending on factors such as the material of the top wall, the size and shape of the shield, and the tool used to peel back the wall, the use of grooves may not be necessary. For example, certain embodiments may utilize a top wall material that can be easily separated from the sidewalls without the need for any grooves. Certain embodiments may also utilize a series of small apertures or other indentations in the top wall instead of a groove.

Figure 6A:
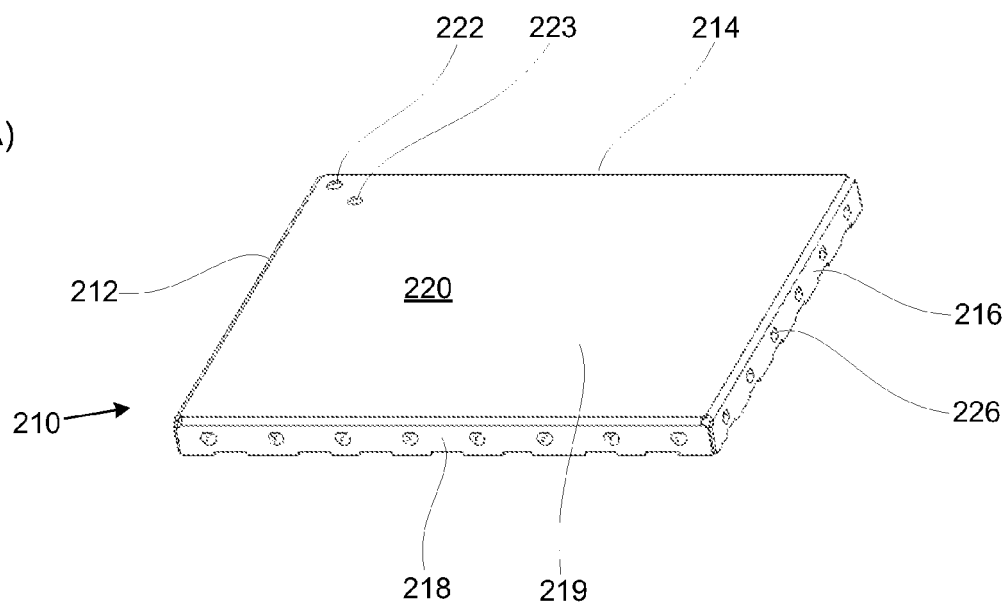
FIGS. 6(A) and 6(B) illustrate surfaces of a reworkable shield, in accordance with certain embodiments.
Figure 6B:
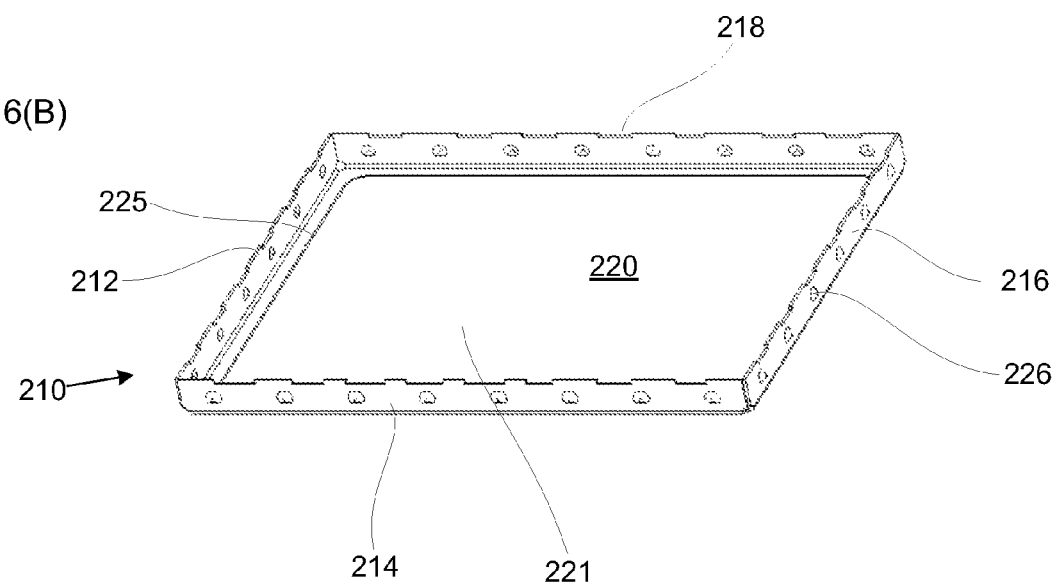

FIGS. 6(a) and 6(B) illustrate an RF shield 210 embodiment with a different groove structure than that illustrated in FIGS. 1-2. The shield 210 includes a plurality of bumps 226 on side surfaces 212, 214, 216, 218. As seen in FIG. 6(A), the shield 210 is formed with apertures 223 and 224 extending through the top wall 220. The shield 210 includes no groove on the top surface of the top wall 220. As seen in FIG. 6(B), the shield 210 is formed with a groove 225 on a lower surface 221 of the top wall 220. The aperture 222 is positioned to be in contact with the groove 225. The groove 225 may be substantially V-shaped in geometry, and may extend adjacent to the side surfaces 212, 214, 216, 218. Other variations of the groove geometry and structure are also possible.

Figure 7:
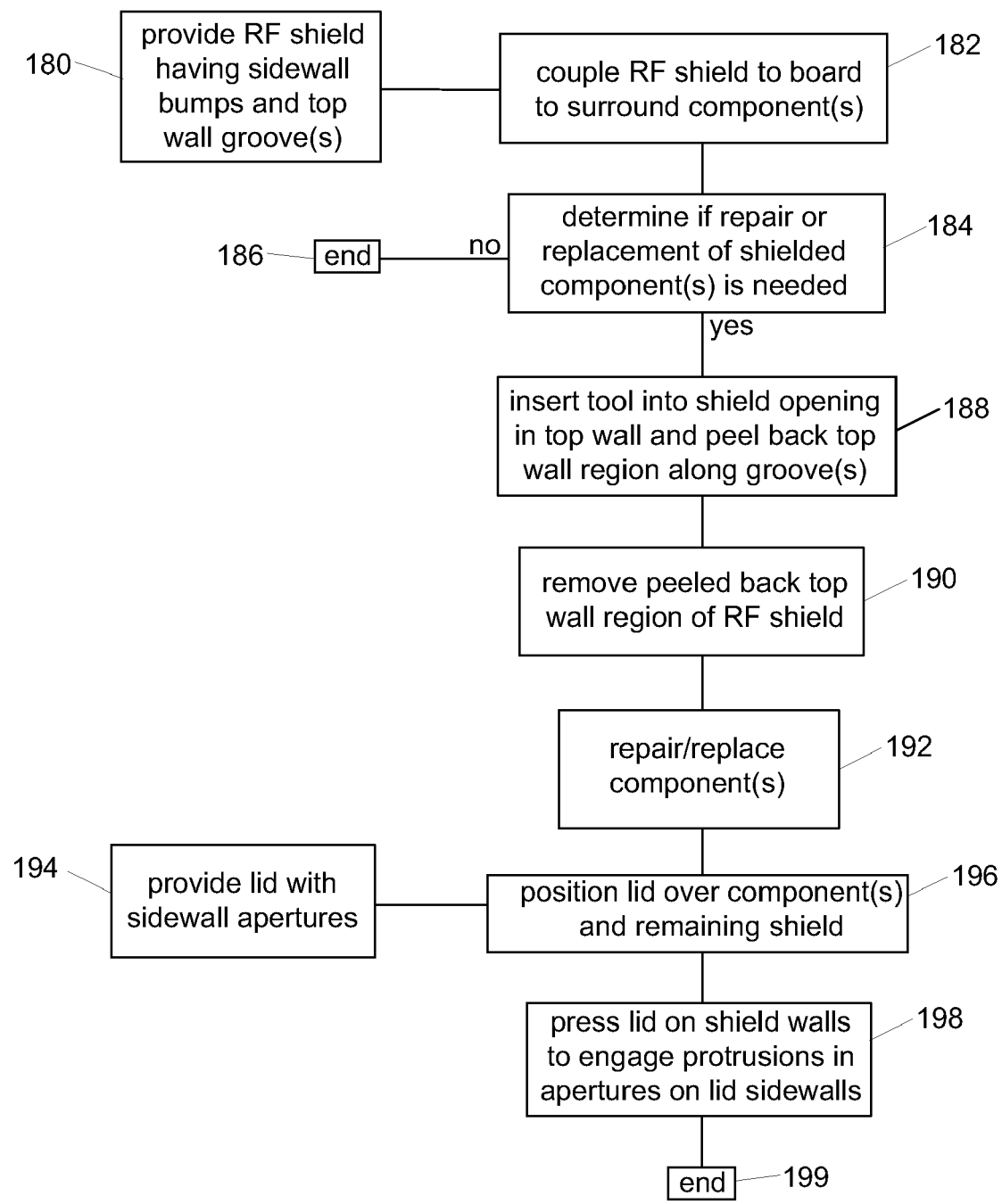
FIG. 7 illustrates a flow chart for a process relating to a reworkable RF shield, in accordance with certain embodiments.

Certain embodiments relate to processes utilizing reworkable RF shields such as described above. FIG. 7 illustrates a flow chart for such a process. Box 180 is providing an RF shield. The RF shield may include sidewall bumps (for example, the bumps 26 illustrated in FIG. 1) extending outward therefrom. The RF shield may also include one or more grooves, such as a groove on the upper surface of the top wall of the RF shield, and/or a groove on the lower surface of the top wall of the shield. Box 182 is coupling the RF shield to a substrate such as a motherboard, so that the RF shield surrounds one or more components. Box 184 is determining if the one or more components surrounded by the RF shield need to be repaired or replaced. This may be accomplished in certain embodiments by using known testing and characterization techniques. If no repair or replacement is needed, then the process ends (Box 186) and no reworking of the RF shield is necessary. If repair or replacement is needed, Box 188 is peeling back the top surface of the RF shield. This may be accomplished by inserting a tool into an opening in the top wall of the RF shield and applying a force to peel back at least part of the top wall along the groove(s) formed thereon. Box 190 is removing the peeled back portion of the top wall of the RF shield. The exposed component(s) may then be repaired or replaced as needed, as indicated in Box 192.

Box 194 is providing a lid for the RF shield. The lid may include a plurality of sidewall apertures (for example, the apertures 126 in FIG. 3) which are sized to accept the bumps extending outward from the RF shield sidewalls. Box 196 is positioning the lid over the exposed component(s) and the remaining shield. Box 198 is pressing the lid onto the RF shield sidewalls to engage the bumps in the apertures in the lid for a tight fit. The process is then complete, as indicated in Box 199. It should be appreciated by one of ordinary skill that certain of the operations described above and illustrated in FIG. 7 may be optional or can be modified. For example, certain embodiments may utilize a shield having no grooves. Other embodiments may include a top wall that can be removed without inserting a tool through an opening in the shield.

Figure 8:
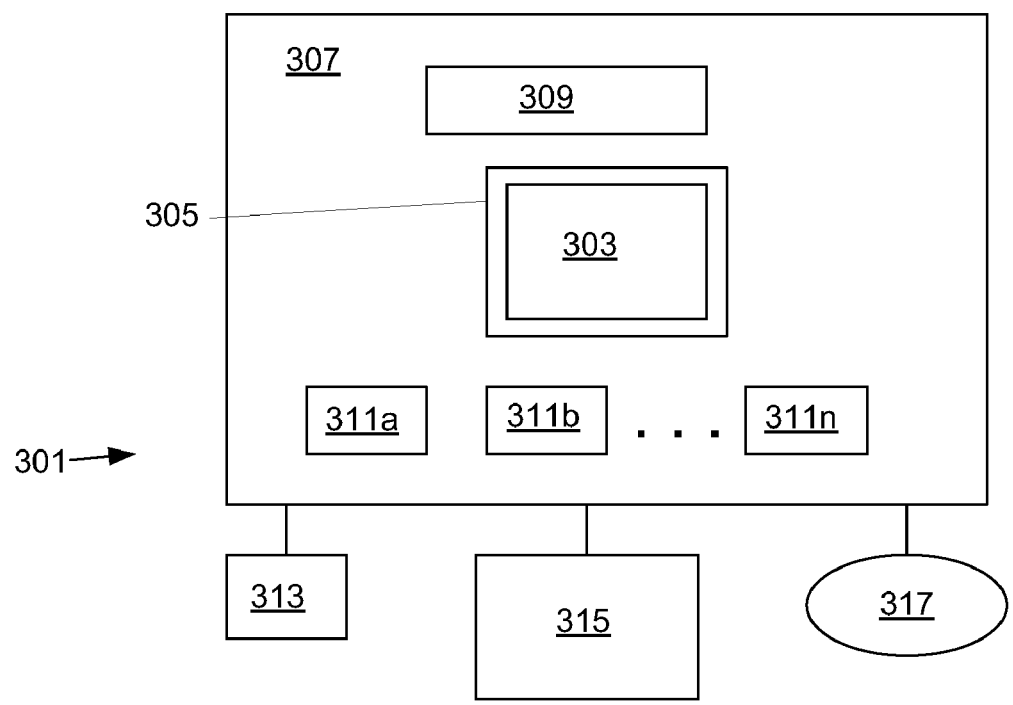
FIG. 8 illustrates one example of a computing environment in which aspects of certain embodiments may be embodied.

Assemblies including a reworkable RF shield as described in embodiments above may find application in a variety of electronic components, for example, mobile computers, mobile phones and other wireless transmission or receiving devices. FIG. 8 schematically illustrates one example of an electronic system environment in which aspects of described embodiments may be embodied. Other embodiments need not include all of the features specified in FIG. 8, and may include alternative features not specified in FIG. 8.

The system 301 of FIG. 8 may include at least one central processing unit (CPU) 303. The CPU 303, also referred to as a microprocessor, may be a chip which is attached to an integrated circuit package substrate 305, which is then coupled to a printed circuit board 307, which in this embodiment, may be a motherboard. The system 301 further may further include memory 309 and one or more controllers 311a, 311b . . . 311n, which are also disposed on the motherboard 307.

In certain embodiments, one or more of the controllers 311a, 311b . . . 311n may include an RF shield. For example, the controller 311 a may in certain embodiments be a card such as a mobile communications card that plugs into a mobile computer, and that includes a wireless transmitter and/or receiver for controlling communications, receiving and sending other data, and the like, using RF energy, and thus requiring an RF shield which may be formed in accordance with embodiments as described above. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards that are mounted on the motherboard. The CPU 303, memory 309 and controllers 311a, 311b . . . 311n may each be seated in individual sockets or may be connected directly to a printed circuit board. A display 315 may also be included. A variety of components may utilize an RF shield formed in accordance with embodiments described herein.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An RF shield comprising:
a plurality of sidewalls and an interconnecting top wall, the sidewalls and top wall sized to shield one or more electrical components on a substrate;
the sidewalls including a plurality of bumps extending outward therefrom;
the top wall including a removable portion and a fixed portion, the removable portion being completely separable from the fixed portion and the side walls of the RF shield;
a first groove on a top surface of the top wall, and a second groove on a bottom surface of the top wall, the grooves being V-shaped in cross section; and
a lid adapted to fit on the sidewalls.

2. The RF shield of claim 1, wherein the bumps have a substantially conical shape.

3. The RF shield of claim 1, wherein each of the sidewalls includes a plurality of bumps extending outward therefrom.

4. The RF shield of claim 1, wherein the bumps are integral to the sidewalls and include no apertures therein.

5. The RF shield of claim 1, wherein the lid includes a plurality of apertures, the apertures sized to engage the bumps when the lid is properly positioned on the sidewalls.

6. The RF shield of claim 1, wherein the bumps have a D-shaped perimeter.

7. The RF shield of claim 1, the top wall having a thickness, the first groove extending partially through the thickness of the top wall.

8. The RF shield of claim 1, further comprising first and second apertures in the top wall, the first aperture in contact with the groove, the second aperture spaced a distance away from the groove, the second aperture sized to accept a tip portion of a tool.

9. The RF shield of claim 1, wherein the removable portion is completely separated from the fixed portion when the lid is fit on the sidewalls.

10. A system comprising:
an electronic device mounted to a substrate, the electronic device utilizing RF energy, the electronic device being surrounded by an RF shield;
memory; and
a display;
wherein the RF shield comprises a plurality of sidewalls and an interconnecting top wall, the sidewalls each including a plurality of bumps extending outward therefrom, the top wall including a removable portion and a fixed portion, the removable portion being completely separable from the fixed portion and the side walls of the RF shield, a first groove formed on one surface selected from the group consisting of a top surface and a bottom surface of the top wall, first and second apertures in a corner region of the top wall, the first aperture in contact with the first groove, the second aperture spaced a distance away from the first groove, the second aperture sized to accept a tip portion of a tool.

11. The system of claim 10, further comprising a lid, wherein the lid includes a plurality of apertures, the apertures sized to engage the bumps when the lid is properly positioned on the sidewalls.

12. The system of claim 11, wherein the removable portion of the top wall is completely separated from the fixed portion of the top wall when the lid is properly positioned on the sidewalls.

13. The system of claim 10, the RF shield further comprising a second groove formed on the other of the top surface and bottom surface of the top wall.

14. The system of claim 10, the RF shield further comprising a groove that is V-shaped in cross section formed on a surface of the top wall.

15. A method of processing a device having a component shielded by an RF shield, comprising:
positioning an RF shield to surround a component on a substrate, the RF shield including a plurality of sidewalls and a top wall, the top wall including a fixed portion and a removable portion, the plurality of sidewalls including bumps extending outward therefrom, the removable portion being fully separable from the fixed portion and the side walls of the RF shield, the top wall including a first groove on a top surface of the top wall, the top wall having a thickness, the first groove extending partially through the thickness of the top wall, the top wall including a second groove on a bottom surface of the top wall, the second groove extending partially through the thickness of the top wall;

removing the removable portion of the top wall from the RF shield to expose the component, wherein the removable portion of the top wall is completely separated from the fixed portion and the side walls of the RF shield, wherein the removing the removable portion of the top wall from the RF shield includes peeling back the removable portion of the top wall along the groove on the top surface of the top wall and along the groove on the bottom surface of the top wall;

positioning a lid over the exposed component and in contact with the bumps extending outward from the sidewalls; and positioning the lid so that the bumps engage apertures in the lid and result in the lid being rigidly coupled to the sidewalls.

* * * * *